United States Patent [19]

Yoshida et al.

[11] 4,080,715
[45] Mar. 28, 1978

[54] PROCESS FOR PRODUCTION OF LAMELLAR GRAPHITE-CONTAINING MATERIAL

[75] Inventors: Chisato Yoshida, Akashi; Takasuke Mori, Ashiya, both of Japan

[73] Assignee: Kobe Steel, Ltd., Kobe, Japan

[21] Appl. No.: 778,112

[22] Filed: Mar. 16, 1977

[30] Foreign Application Priority Data

Mar. 16, 1976  Japan ................................. 51-29004

[51] Int. Cl.² .......................... C21D 5/14; C22F 1/10; C21D 7/14
[52] U.S. Cl. ...................................... 29/527.7; 148/2; 148/12 R; 148/11.5 N
[58] Field of Search ................ 29/527.7, 527.5; 148/2, 148/12 R, 11.5 N

[56] References Cited

U.S. PATENT DOCUMENTS

| 3,635,769 | 1/1972 | Shaw | 148/2 X |
| 3,893,873 | 7/1975 | Hanai et al. | 148/12 R |

*Primary Examiner*—Milton S. Mehr
*Attorney, Agent, or Firm*—Oblon, Fisher, Spivak, McClelland & Maier

[57] ABSTRACT

Lamellar graphite-containing iron based and nickel based alloys are prepared by unidirectionally solidifying an iron base or nickel base alloy having a carbon content of 2 to 5% at a solidification rate not greater than 10 mm/hr and subjecting the solidified alloy to a hot plastic deformation processing in a direction parallel to the solidification direction.

9 Claims, 11 Drawing Figures

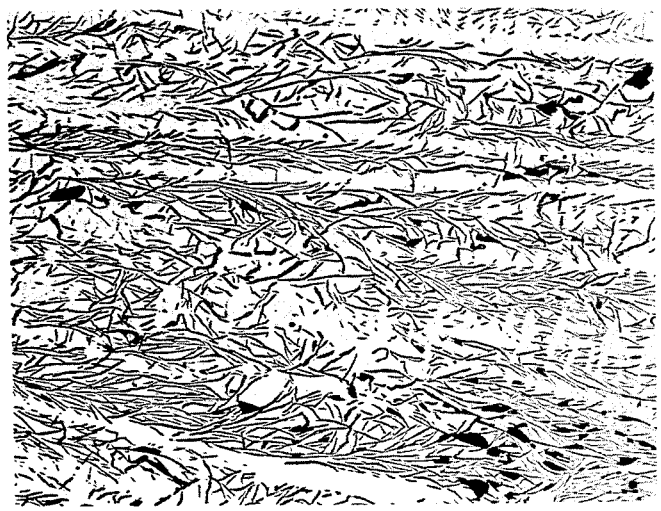
FIG.4 (x20)
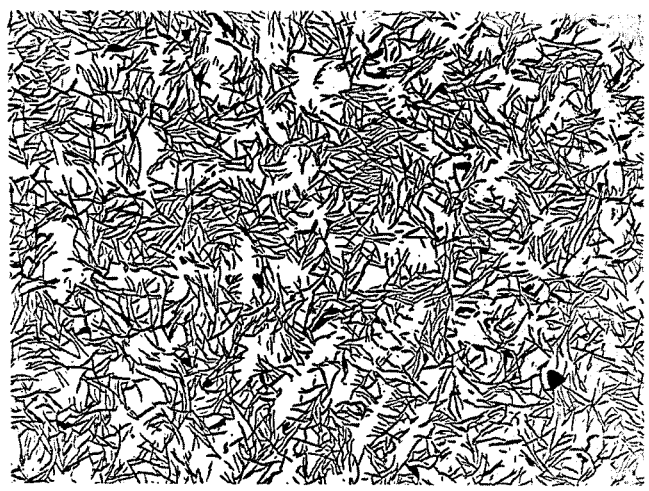
FIG.5 (x20)
FIG.6 (x990)

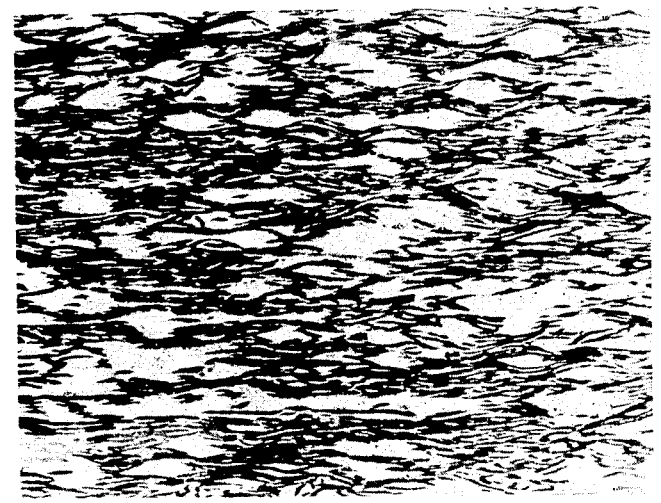
FIG. 9 (×20)
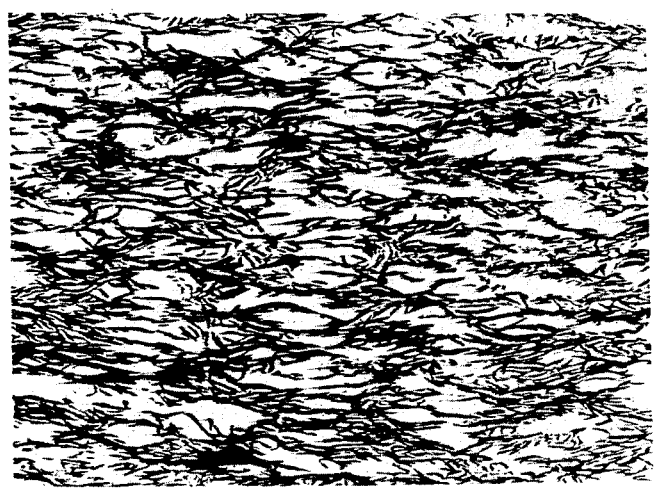
FIG. 10 (×20)

PROCESS FOR PRODUCTION OF LAMELLAR GRAPHITE-CONTAINING MATERIAL

BACKGROUND OF THE INVENTION

1. Field of the Invention

The present invention relates to a process for the production of lamellar graphite-containing materials. More particularly, the invention relates to a process for the production of lamellar graphite-containing materials having physically anisotropic characteristics.

2. Description of the Prior Art

Various processes are known for the preparation of electric articles based on carbon or graphite. A process for preparing electric resistor elements of carbon or graphite is disclosed in Japanese Patent Application Laid-Open Specification No. 82997/74 (Siemens AG). In this known process, an electric resistor element comprising a support of an inorganic, electrically insulating, silicon-containing material, a conductor coating composed of elemental carbon deposited on the support and electric terminals mounted at the terminal portions of the coating is prepared. Further, Japanese Patent Application Laid-Open Specification No. 60796/75 (Matsushita Electric) discloses a process for the production of volume resistors comprising uniformly dispersing carbon black which has been heat-treated in a non-oxidizing atmosphere maintained at 1600° to 2700° C in a resin. The object of this procedure is to improve the soldering heat resistance, temperature characteristics and humidity characteristics of the resistors while maintaining the excellent electric noise characteristics and voltage coefficient inherent in carbon black. Still further, Japanese Patent Application Laid-Open Specification No. 131096/75 (Murata Mfg. Co.) shows a resistor material of the low resistant carbon-resin type which can be used as a thick film resistor element in a variable resistor or the like. Moreover, Japanese Patent Application Laid-Open Specifications No. 152295/75 and No. 152296/75 (Fujitsu Limited) disclose a process for the production of super-high resistors comprising aging a thermosetting resin containing carbon black and coating and baking the aged resin composition on a substrate.

However, not one of the above-discussed processes discloses a process for preparing lamellar graphite-containing materials having physically anisotropic characteristics from an iron base or nickel base alloy.

SUMMARY OF THE INVENTION

Accordingly, a primary object of the present invention is to provide a process for the production of a graphite-containing material having a lamellar graphite structure.

Another object of the present invention is to provide a process for the production of a lamellar graphite-containing material having specific physical properties and possessing excellent corrosion resistance and damping properties.

In accordance with the first aspect of the present invention, a process is provided for preparing a lamellar graphite-containing material from an iron based or nickel based alloy containing 2 to 5% carbon, which comprises unidirectionally solidifying the iron based or nickel based alloy at a solidification rate not greater than 10 mm/hr and subjecting the solidified alloy to hot plastic deformation processing in a direction parallel to the solidification direction.

In accordance with the second aspect of the present invention, a process within the limits of the first aspect is provided wherein the plastic deformation processing is conducted at a temperature of 900° to 1000° C.

In accordance with the third aspect of the present invention, a process within the limits of the first aspect is provided wherein the plastic deformation processing is conducted at a draft of at least 74%.

In accordance with the fourth aspect of the present invention, a process within the limits of the first aspect is provided wherein the hot plastic deformation processing is hot rolling.

In accordance with the fifth aspect of the present invention, a process within the limits of the first aspect is provided wherein the hot plastic deformation processing is hot forging.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 4 is a view illustrating the microscopic structure of the plane in a sample parallel to the solidification direction obtained by the unidirectional solidification procedure of the present invention;

FIG. 5 is a view illustrating the microscopic structure of the plane in a sample vertical to the solidification direction obtained by the unidirectional solidification procedure of the present invention;

FIG. 6 is a scanning electronic microscope photograph of flake graphite obtained by the unidirectional solidification procedure of the present invention;

FIG. 9 is a view illustrating the microscopic structure of the plane parallel to the solidification direction in the graphite structure of a material subjected to the hot plastic deformation processing of the procedure of the present invention; and FIG. 10 is a view illustrating the microscopic structure of the plane vertical to the solidification direction in the graphite structure of a material subjected to the hot plastic deformation processing of the procedure of the present invention.

DETAILED DESCRIPTION OF THE PREFERRED EMBODIMENTS

The lamellar graphite containing material according to the present invention is prepared from an iron based or nickel based alloy which has a carbon content of 2 to 5% as the starting material. By treating this starting material according to the process detailed hereinafter, a material having physically anisotropic characteristics can be obtained.

Ordinary cast iron is a typical example of an iron based alloy having a carbon content of 2 to 5%. Accordingly, the detailed description of the invention hereinafter will be presented in terms of ordinary cast iron.

As is well known in the art, cast iron is an iron alloy having a relatively high carbon content. Moreover, silicon is an important element which is present in the cast iron. Any iron based or nickel based alloy containing carbon and silicon is included as a starting material of the present invention.

When cast iron is molten and cast into a mold, various solidification structures are observed depending on the solidification rate. Moreover, the strength of the cast iron is considerably influenced by this solidification structure. When the iron is melted, cast and solidified at a given rate, carbon in the iron based alloy is divided into a compound of carbon which forms $Fe_3C$ and carbon which forms graphite. It is known that properties of cast iron are changed by the shape, size and distribution state of the formed graphite. In short, the properties of cast iron are substantially influenced by the configuration of graphite in the cast iron. This tendency is also observed in a carbon-containing nickel based alloy.

This phenomenon has been observed and as a consequence research has been conducted from the point of view of developing a material which has specific physical properties by attempting to provide the iron based or nickel based alloy with an heretofore unknown type of graphite structure. The present invention is the result of this investigation.

The configuration or distribution state of the so-called graphite structure appearing in cast iron varies depending upon the rate of cooling employed. It has been believed that in case of spherical graphite cast iron, the addition of Mg or Ce is an important factor. It was therefore believed that in order to impart a heretofore unknown graphite structure to the base alloy it would be necessary to develop a novel preparative technique. Accordingly, the study leading to the present invention involved experimentation with changing preparative conditions. As a result, it has been found that when solidification is unidirectionally performed in succession and the solidification rate is maintained at a level not greater than 10 mm/hr in preparing cast iron from a melt, a flake-like graphite structure rich in a directional property (aligned regularly in the direction parallel to the solidification direction) is obtained.

Figure 1:
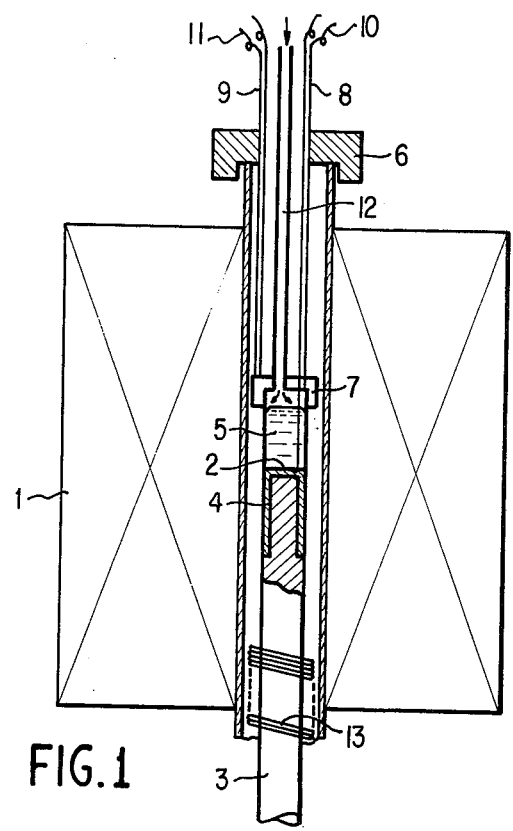
FIG. 1 is a sectional view which illustrates diagrammatically a unidirectionally solidifying apparatus that is used in the process of the present invention.
Figure 2:
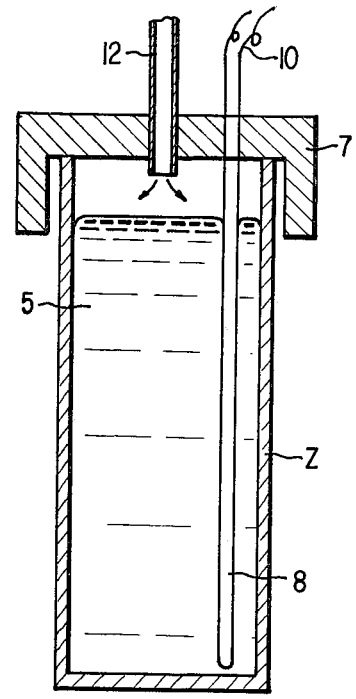
FIG. 2 is an enlarged sectional view showing the crucible portion of the apparatus shown in FIG. 1.

FIG. 1 is a diagram which illustrates an example of the apparatus for conducting the unidirectional solidification process according to the present invention. FIG. 2 is an enlarged sectional view of the melt reservoir (crucible) of the apparatus shown in FIG. 1. This apparatus includes a heater 1 composed of silicon carbide and a vertically movable shaft 3 which is inserted in the interior of the heater 1. A cover 4 composed of alumina is capped on the upper portion of the shaft 3, and an alumina crucible 2 is supported on the upper portion of the shaft 3. A molten metal 5 of an iron based or nickel based alloy is contained in the crucible 2. A protecting tube 8 penetrates caps 6 and 7 and is immersed in the molten metal, and a thermocouple 10 for measuring the solidification rate is inserted into the protection tube 8. A pipe 12 penetrating caps 6 and 7 is opened above the crucible 2 to protect molten metal 5 which is introduced in crucible 2 by the flow of an inert gas in the directions indicated by the arrows to prevent decarburization in the molten metal. A thermocouple 11 for adjusting the furnace temperature is inserted in protection tube 9 which penetrates cap 6. A water cooled coil 13 is disposed in the lower portion of the heater 1 to cover the lower portion of the shaft 3.

In the apparatus having the above structure, the material contained in crucible 2 is heated by heater 1 to form molten metal mass 5. Since the crucible 2 is supported by the vertically movable shaft 3, if the shaft 3 is gradually lowered, crucible 2 is also gradually lowered and it is positioned within the water cooled coil 13. Since cooling water is running through the water cooled coil 13, the crucible 2 is gradually cooled from the bottom and hence, the molten metal mass 5 is gradually cooled from the bottom. In short, the molten metal 5 is unidirectionally cooled and solidified. The solidification rate is measured by thermocouple 10. Adjustment of the solidification rate is very important in the unidirectional solidification step. It has been found that only when the solidification is adjusted to a level not greater than 10 mm/hr, a flake graphite structure aligned substantially in one direction as shown in the photograph of FIG. 4 is obtained. It has also been found that a preferred solidification rate is in the range of 4 to 7 mm/hr. In such a solidification rate adjusting apparatus, it has been found that in order to prevent the formation of an abnormal structure of graphite, such as a banded structure, it is advantageous to maintain the heat equilibrium precisely in the furnace by using thermocouple 11 to adjust the furnace temperature.

In general, the electric resistance of graphite is changed depending on the crystal direction of the graphite. Flake graphite has a hexagonal structure as well as a thin flaky structure. Accordingly, in the flake graphite structure aligned substantially in one direction as shown in FIG. 4, there is a great difference in the electric resistance of the base alloy between the direction parallel to the alignment direction and the direction vertical to the alignment direction. As a result of actual measurement tests, it has been confirmed that the electric resistance in the vertical direction is about 1.5 to about 2.3 times the electric resistance in the parallel direction. However, it has been confirmed that no particular anisotropic physical characteristics exist in such flake graphite.

Figure 3I:
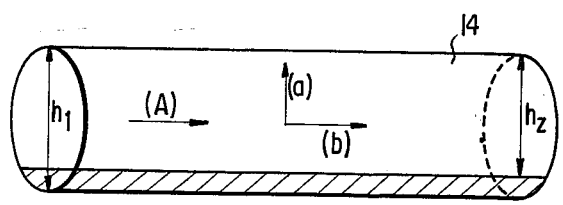
FIG. 3(I) is a perspective of a sample obtained by the unidirectional solidification process of the present invention.
Figure 3:
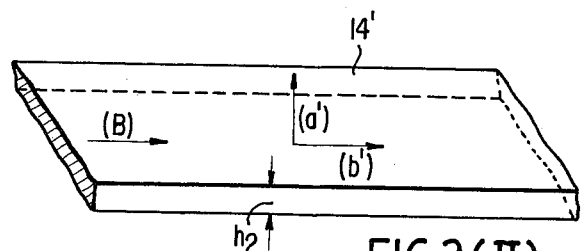
FIG. 3(II) is a perspective of a sample obtained by the rolling processing step in the process of the present invention.

It was believed, however, that physical anisotropy could be introduced into the flake graphite structure by subjecting the alloy to a certain processing condition and investigations were conducted to achieve this objective. As a result, it was found that only when hot plastic deformation processing such as rolling or forging is conducted on a sample in a direction parallel to the above-mentioned solidification direction, a material containing a very peculiar graphite structure can be obtained, and the physical anisotropic characteristics of the material are conspicuous. FIG. 3 illustrates such a processing method. More specifically, FIG. 3(I) shows a unidirectionally solidified material 14 before processing and FIG. 3(II) shows a molded material 14' after processing. In the drawings, arrow A indicates the solidification direction and arrow B denotes the processing direction, and arrows a, b, a' and b' designate anisotropic characteristics of the materials 14 and 14', which will be detailed hereinafter. The hot plastic deformation processing that is conducted in the process of the present invention may be rolling or forging, so far as the material can be compressed and reduced to a rectangular shape in the solidification direction by the plastic deformation processing. The processing conditions are not particularly limited in case of either rolling or forging. For example, the rolling temperature is not particularly critical. In general, hot rolling is employed and good results are obtained when the rolling temperature is in the range of from 900° to 1000° C., although the preferred rolling temperature varies to some extent depending on the kind of the starting material employed. Further, the draft, i.e., the degree of deformation, of the processing step such as the rolling or forging step is not particularly critical but it has been found that good results generally are obtained when the draft calculated according to the following formula is at least 74%:

$$\text{Draft (\%)} = (h_1 - h_2/h_1) \times 100$$

wherein $h_1$ stands for the thickness of the sample before processing and $h_2$ stands for the thickness of the sample after processing.

The graphite structure of the thus obtained material is lamellar in a direction parallel to the rolling direction as shown in FIG. 9. Such a lamellar structure in such iron and nickel based alloys is not known in the art, and it would be expected that such a material would have peculiar characteristics. In fact, as detailed hereinafter, the material not only has prominent physical anisotropic characteristics, but also possesses excellent damping properties and corrosion resistance. Therefore, because of these improved characteristics the material can be used advantageously in a variety of applications.

The above-mentioned iron based or nickel based alloy that is used as the starting material in the process of the present invention may also contain graphitization-promoting elements such as Si, Ni, Cu and Al and elements which improve the mechanical properties according to need. It has been found that when Si is incorporated in an alloy in an amount of up to 4%, good results are obtained. It is naturally necessary to reduce the content of such graphitization-inhibiting elements as Cr, Ti, Pb, As and Sb and impurities such as S and P as much as possible.

Having generally described this invention, a further understanding can be obtained by reference to certain specific examples which are provided herein for purposes of illustration only and are not intended to be limiting unless otherwise specified.

EXAMPLE

An Fe—C alloy was prepared from electrolytic iron and electrode carbon, and metallic silicon was added to the alloy by vacuum smelting to obtain an Fe—C—Si alloy. The alloy was cast in a rod-like mold to form a starting material, which was found to have the following chemical composition:

C: 3.75%
Si: 1.77%
Mn: 0.04%
P: 0.005%
S: 0.007%

Figure 7:
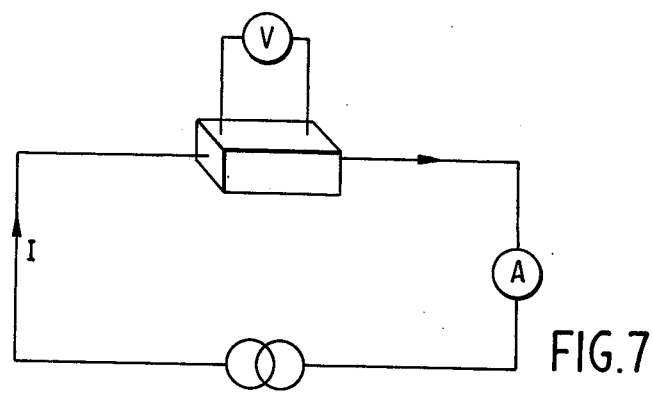
FIG. 7 is a diagram illustrating a method for measuring the electric resistance of a sample.

The balance of the sample was iron and impurities and the saturation degree of carbon $$Sc \left( = \frac{\% C}{4.23 - \frac{\%Si + \%P}{3.2}} \right)$$

was 1.05. This starting material was heated and melted in crucible 2 of the unidirectional solidification apparatus shown in FIG. 1, and the necessary apparatus accessories such as thermocouples were arranged as shown in FIG. 1. The furnace temperature was adjusted to 1250° C. and cooling water was passed through the water cooled coil 13 so that the temperature gradient at the cooling portion was about 20° C./cm. The temperature gradient is not particularly critical in the present invention and it can be set as desired. However, it was found that at too low a temperature gradient the alignment of graphite becomes unstable to some extent. The supporting shaft 3 was gradually lowered and the material was unidirectionally solidified at a rate not greater than 10 mm/hr whereby a columnar body having a diameter of 37 mm and a length of 130 mm was obtained. The results of microscopic observation of the graphite structure of the thus prepared material are as shown in FIGS. 4 and 5. FIG. 4 shows the plane of the sample in a direction parallel to the solidification direction and FIG. 5 shows the plane of the sample in a direction vertical to the solidification direction. From FIG. 4 it can be observed that a flake graphite structure parallel to the solidification direction is formed, but in FIG. 5 no directional characteristic is observed in the alignment of the graphite. The results of the scanning electron microscope observation are shown in FIG. 6, from which it can be observed that the (0001) plane of the hexagonal system has a mica-like structure of piled flakes. Thus, it was estimated that the electric resistance in a direction vertical to the (0001) plane would be much higher than the electric resistance in a direction parallel to the (0001) plane. Therefore, it was expected that the physical anisotropic characteristics would be conspicuous in the graphite structure as shown in FIG. 4. However, in the above sample having a columnar shaped body of a diameter of 37 mm and a length of 130 mm and wherein the thickness $h_3$ formed when the thermocouple-emerged portion 14a was cut away parallel to the shaft in FIG. 3(I) was adjusted to 27 mm, the electric resistance was 30 to 46 $\mu\Omega$-cm in direction $a$ and 20 $\mu\Omega$-cm in direction $b$, but anisotropic physical characteristics were not very conspicuous. The electric resistance was measured on a specimen having a columnar shaped body of 2 mm × 2 mm × 5 mm by using the measurement apparatus shown in FIG. 7.

The unidirectionally solidified material was then hot-rolled at 900° to 1000° C as shown in FIG. 3(II). When the draft was calculated according to the previously described formula based on the thickness of $h_2 = 7$ mm of the unidirectionally solidified material, it was found that the draft was 74%. The microscopic observation results of the graphite structure of the thus obtained material are as shown in FIGS. 9 and 10. FIG. 10 shows the plane parallel to the processing direction, i.e., parallel to the solidification direction, in which a lamellar graphite structure parallel to the solidification is observed. FIG. 10 shows the plane vertical processing direction. From these figures, it can be readily understood that in the material obtained, the anisotropic characteristics are much more conspicuous than for the material shown in FIG. 5. When the electric resistance was measured on a 2 mm × 2 mm × 5 mm specimen formed from the thus obtained material according to the above-mentioned method, it was found that the electric resistance was about 600 $\mu\Omega$-cm in direction $a'$ in FIG. 3(II) and about 30 $\mu\Omega$-cm in direction $b'$. Specifically, the former electric resistance was about 20 times the latter electric resistance. Therefore, it can be concluded that in a nickel or iron based alloy containing a flake graphite structure obtained by unidirectional solidification, no substantial physical anisotropic characteristics are observed, but if such a material is further subjected to unidirectional processing, conspicuous physical anisotropic characteristics can be developed.

Figure 8:
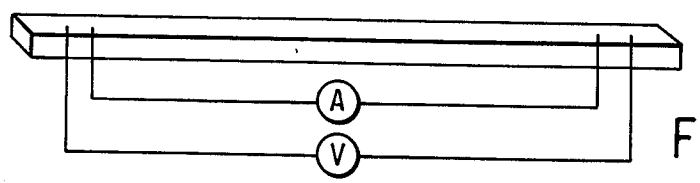
FIG. 8 is a diagram illustrating another method for measuring the electric resistance of a sample.

Cast iron materials differing in composition from the above-described composition were similarly processed into lamellar graphite containing materials and the electric resistance was measured according to the above-mentioned method whereby the results shown in Table 1 were obtained. From these results it will be readily understood that such anisotropic characteristics of an electric resistance ratio of about 8 to 40 can be attained. In Table 1, the values of the electric resistance were determined according to the method illustrated in FIG. 7, but the values denoted by the asterisks are those which were determined according to the method shown in FIG. 8 in which 2 mm × 2 mm × 130 mm specimens were used.

rials, materials for heat exchangers, heat-insulating construction materials and the like.

Having now fully described the invention, it will be apparent to one of ordinary skill in the art that many changes and modifications can be made thereto without departing from the spirit or scope of the invention as set forth herein.

What is claimed as new and intended to be secured by Letters Patent is:

1. A process for preparing a lamellar graphite-containing material from an iron based or nickel based alloy containing 2 to 5% carbon, which comprises:
   a. unidirectionally solidifying said iron based or nickel based alloy at a solidification rate not greater than 10 mm/hr. and
   b. subjecting the solidified alloy to hot plastic deformation processing in a direction parallel to the solidification direction.

2. The process of claim 1, wherein the plastic deformation processing is conducted at a temperature of 900° to 1000° C.

3. The process of claim 1, wherein the plastic deformation processing is conducted at a draft of at least 74%.

4. The process of claim 1, wherein the hot plastic deformation processing is hot rolling.

Table 1

| Sample No. | Preparation Conditions | Electric Resistance ($\mu\Omega$-cm) | | | |
| --- | --- | --- | --- | --- | --- |
| | | unidirectionally solidified cast iron | | rolled or forged cast iron | |
| | | parallel to solidification direction | vertical to solidification direction | parallel to processing direction | vertical to processing direction |
| 1 | C=3.9%, Si=1.7%, Sc=1.05, solidification rate = 4 mm/hr, forging | 60* | — | 22–40 (28 on average) | 240–1292 (600 on average) |
| 2 | " | — | 40–46 (44 on average) | — | — |
| 3 | " | — | — | 40* | — |
| 4 | C=3.7%, Si=1.8%, Sc=1.01, solidification rate = 7 mm/hr, rolling | 20 | 30 | 17–48 | 140 |

The present invention for purposes only of illustration has been mainly discussed in terms of iron based alloys. However, results substantially the same as those described above were similarly obtained in case of nickel based alloys. Further, the physical anisotropic characteristics of the product of the invention have been described mainly with reference to electric resistance, but it has been confirmed that anisotropic characteristics are manifested also with respect to magnetic and thermal properties. Further, the material according to the present invention exhibits substantially superior damping properties and corrosion resistance in comparison to conventional cast iron materials. Therefore, it is expected that the material of the present invention can be used in various fields broadly as electric resistance materials, magnetic materials, vibration-insulating mate- 5. The process of claim 1, wherein the hot plastic deformation processing is hot forging.

6. The process of claim 1, wherein said solidification rate ranges from 4 to 7 mm/hr.

7. A lamellar graphite containing iron based or nickel based alloy obtained by the process of claim 1.

8. The iron based or nickel based alloy of claim 7, wherein said graphite has a flake-like structure.

9. The iron based or nickel based alloy of claim 8, wherein the electric resistance of said alloy in a direction vertical to the alignment direction of said flake graphite is 1.5 to 2.3 times that of the electric resistance of said alloy in the direction parallel to the alignment direction of said flake graphite.

* * * * *